(12) United States Patent
Nomura (10) Patent No.: US 7,795,133 B2
(45) Date of Patent: Sep. 14, 2010

(54) SEMICONDUCTOR DEVICE AND METHOD OF MANUFACTURING THE SAME

(75) Inventor: Kotaro Nomura, Toyama (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 12/332,392

(22) Filed: Dec. 11, 2008

(65) Prior Publication Data
US 2009/0152732 A1 Jun. 18, 2009

(30) Foreign Application Priority Data
Dec. 14, 2007 (JP) ............................. 2007-322662

(51) Int. Cl.
*H01L 21/4763* (2006.01)
(52) U.S. Cl. ...................... 438/622; 438/623; 438/627; 257/E21.577; 257/E21.579
(58) Field of Classification Search ................ 438/622, 438/623, 625, 627, 628, 629, 637, 638, 639, 438/E21.577, E21.579
See application file for complete search history.

(56) References Cited

U.S. PATENT DOCUMENTS

| 7,101,784 | B2 * | 9/2006 | Clevenger et al. ............ 438/623 |
| 2004/0183164 | A1 | 9/2004 | Usami ........................ 257/642 |
| 2007/0117371 | A1 | 5/2007 | Engbrecht et al. ........... 438/622 |
| 2008/0054467 | A1 | 3/2008 | Ohba et al. .................. 257/751 |

FOREIGN PATENT DOCUMENTS

JP         2007-27347          2/2007

* cited by examiner

*Primary Examiner*—Hoai V Pham
(74) *Attorney, Agent, or Firm*—Steptoe & Johnson LLP (57) ABSTRACT

By covering inner surfaces of a wiring groove 26c and a via hole 27a with a fourth insulation film 25 containing porogen during a manufacturing process of a semiconductor device, an increase in the relative permittivity of the fourth insulation film 25 that is a low-permittivity film on the inner surfaces of the wiring groove 26c and the via hole 27a can be suppressed in a manufacturing process of a semiconductor device such as a barrier metal sputtering process.

7 Claims, 7 Drawing Sheets

CHANGES IN RELATIVE PERMITTIVITY AND HYDROCARBON DEGASSING AMOUNT OF FOURTH INSULATION FILM CONTAINING POROGEN

FIG. 6 PRIOR ART

CHANGES IN RELATIVE PERMITTIVITY OF FOURTH INSULATION FILM NOT CONTAINING POROGEN

|  | RELATIVE PERMITTIVITY |
|---|---|
| BEFORE BARRIER METAL SPUTTERING | 3.0 |
| AFTER BARRIER METAL SPUTTERING | 3.5 |

|  | INTER-WIRING CAPACITY |
|---|---|
| PORE SEAL STRUCTURE USING SiC FILM ($\varepsilon$ =4.8) | $1.54 \times 10^{-1}$ pF |
| STRUCTURE ACCORDING TO PRESENT INVENTION USING POROUS FILM ($\varepsilon$ =2.5) | $1.18 \times 10^{-1}$ pF |

FIG. 10

|  | EFFECTIVE PERMITTIVITY OF WIRING |
|---|---|
| PORE SEAL STRUCTURE USING SiC FILM ($\varepsilon$ =4.8) | 3.56 |
| STRUCTURE ACCORDING TO PRESENT INVENTION USING POROUS FILM ($\varepsilon$ =2.5) | 2.97 |

FIG. 11A  DEPTH PROFILES OF ELEMENTS C AND O IN FOURTH INSULATION FILM AFTER ULTRAVIOLET LIGHT IRRADIATION

FIG. 11B  DEPTH PROFILES OF ELEMENTS C AND O IN FOURTH INSULATION FILM AFTER ELECTRON BEAM IRRADIATION

SEMICONDUCTOR DEVICE AND METHOD OF MANUFACTURING THE SAME

FIELD OF THE INVENTION

The present invention relates to a semiconductor device provided with metallic wiring composed of copper or the like and a low-permittivity interlayer insulation film, and a method of manufacturing the same.

BACKGROUND OF THE INVENTION

The increasingly higher integration of semiconductor integrated circuits in recent years has led to higher density in wiring patterns and, in turn, an increase in a parasitic capacitance generated between wires. Since such an increase in the parasitic capacitance causes signal wiring delay, reducing the inter-wiring parasitic capacitance is an important issue in semiconductor integrated circuits that must be operated at high speed. Currently, reduction in the inter-wiring parasitic capacitance is realized by reducing the relative permittivity between wires and of interlayer insulation films.

Conventionally, a silicon dioxide film ($SiO_2$) (relative permittivity of substantially 3.9 to 4.2) or a $SiO_2$ film containing fluorine (F) (relative permittivity of substantially 3.5 to 3.8) has been frequently used as an inter-wiring insulation film. Additionally, in some semiconductor integrated circuits, a carbon-containing silicon oxide film (SiOC) (relative permittivity of substantially 3.0) whose relative permittivity is lower than the conventional $SiO_2$ film is used as an inter-wiring insulation film. Furthermore, more recently, for the purpose of further reducing the inter-wiring parasitic capacitance, a semiconductor device is proposed which uses a low-permittivity film made up of a porous carbon-containing silicon oxide film (porous SiOC) (relative permittivity of substantially 2.5 to 3.0) with a relative permittivity of substantially 3.0 or lower as an inter-wiring insulation film.

However, when using a low-permittivity film made up of SiOC or porous SiOC as an insulation film between wires, the high proportion of Si—$CH_3$ bonds/Si—O bonds in the film causes the Si—$CH_3$ bonds to be separated by plasma processing performed during a barrier metal film formation process or the like, resulting in an increase in high-dielectric Si—O bonds. As a result, the relative permittivity of the SiOC film disadvantageously increases.

In order to eliminate this disadvantage, methods are proposed in which a protective film (pore-seal film) (relative permittivity of substantially 4.7 or higher) whose Si—$CH_3$ bonds are less likely to be separated by plasma processing than a SiOC film is formed on a SiOC film (for example, refer to Japanese Patent Laid-Open No. 2007-027347).

Figure 1:
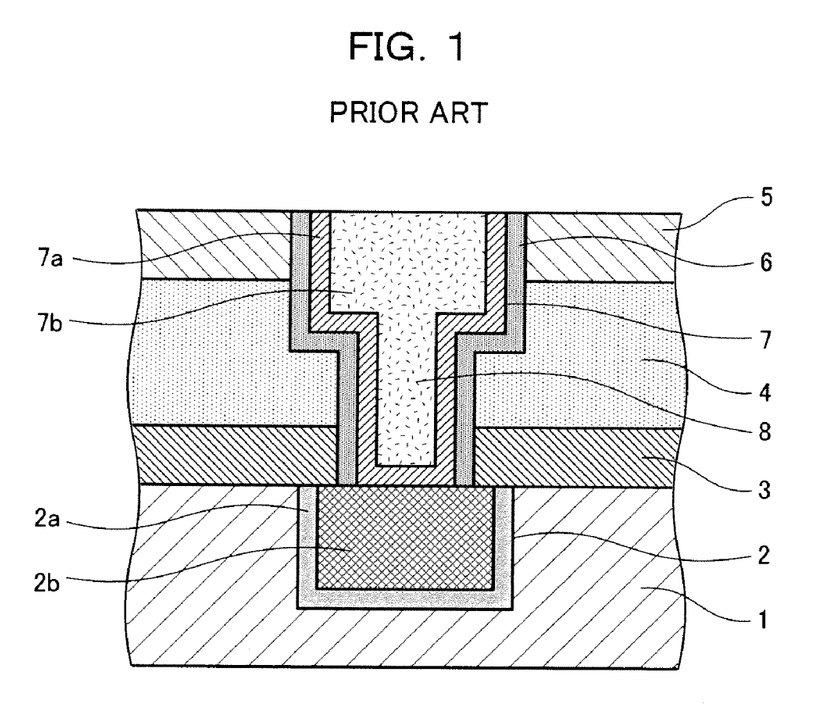
FIG. 1 is a cross-sectional diagram showing the structure of a wiring portion of a conventional semiconductor device.

FIG. 1 shows an example of a wiring structure in a semiconductor device using a general SiOC film as an insulation film between wires. A first metallic wire 2 is formed on a first insulation film 1 made up of a $SiO_2$ film formed on top of a substrate (not shown) composed of silicon by a barrier metal film 2a composed of tantalum nitride (TaN) and a conductive film 2b composed of copper (Cu). A second insulation film 3 composed of silicon carbide (SiC) and which functions as an anti-metallic diffusion film is formed on top of the first insulation film 1 so as to cover the first metallic wire 2. A third insulation film 4 composed of low-permittivity SiOC is formed on top of the second insulation film 3. Furthermore, a fourth insulation film 5 composed of $SiO_2$ is formed on the third insulation film 4.

In this case, a second metallic wire 7 is formed on the third insulation film 4 and the fourth insulation film 5 by a pore seal film 6 composed of SiCN, a barrier metal film 7a composed of TaN and a conductive film 7b composed of Cu. In addition, a via 8 that electrically connects the first metallic wire 2 and the second metallic wire 7 is formed on the second insulation film 3 and the third insulation film 4.

Next, a method of manufacturing a semiconductor device that uses a SiOC film as an insulation film between wires will be described.

FIGS. 2A to 2F show a cross-sectional state of each process in a conventional method of manufacturing a semiconductor device in the sequence of processes.

Figure 2A:
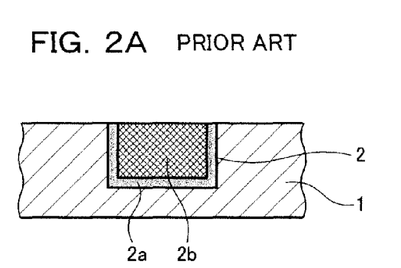
FIG. 2A is a cross-sectional diagram A corresponding to a process in a conventional method of manufacturing a semiconductor device.

First, as shown in FIG. 2A, a metallic wiring groove pattern is formed by a photolithographic method over the first insulation film 1 composed of $SiO_2$ and formed on top of a substrate (not shown). Subsequently, dry etching is performed on the metallic wiring groove pattern to form a wiring groove on the insulation film 1. Next, after depositing the barrier metal film 2a composed of TaN and the conductive film 2b composed of Cu so as to embed the wiring groove, excess Cu is removed by a chemical mechanical polishing (CMP) method to form the first metallic wire 2.

Figure 2B:
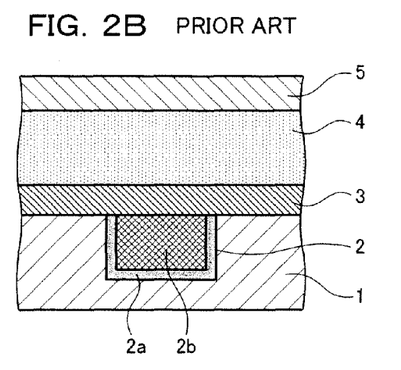
FIG. 2B is a cross-sectional diagram B corresponding to a process in the conventional method of manufacturing a semiconductor device.

Next, as shown in FIG. 2B, the second insulation film 3 composed of SiC is deposited substantially 50 nm on top of the first insulation film 1 so as to cover the first metallic wire 2. The low-permittivity third insulation film 4 composed of SiOC is then deposited substantially 500 nm on top of the second insulation film 3. Subsequently, the fourth insulation film 5 composed of $SiO_2$ is deposited substantially 50 nm on top of the third insulation film 4 by a plasma CVD method.

Figure 2C:
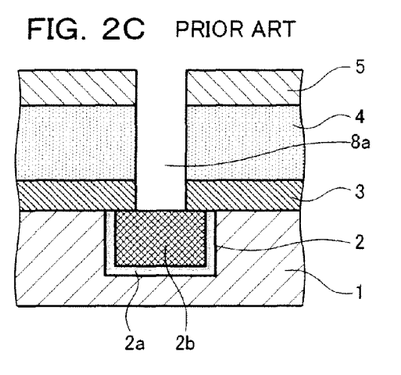
FIG. 2C is a cross-sectional diagram C corresponding to a process in the conventional method of manufacturing a semiconductor device.

Next, as shown in FIG. 2C, after forming a via hole pattern on top of the fourth insulation film 5 by photolithography, the second insulation film 3, the third insulation film 4 and the fourth insulation film 5 are selectively dry-etched to form a via hole 8a that exposes an upper face of the first metallic wire 2.

Figure 2D:
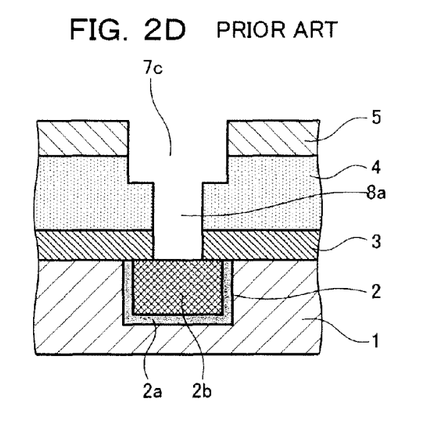
FIG. 2D is a cross-sectional diagram D corresponding to a process in the conventional method of manufacturing a semiconductor device.

Next, as shown in FIG. 2D, after forming a mask on top of the fourth insulation film 5, the third insulation film 4 and the fourth insulation film 5 are selectively dry-etched to form a wiring groove 7c having a desired pattern and depth.

Figure 2E:
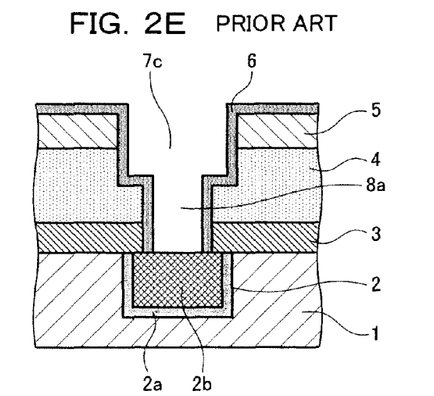
FIG. 2E is a cross-sectional diagram E corresponding to a process in the conventional method of manufacturing a semiconductor device.

Next, as shown in FIG. 2E, the pore seal film 6 is formed on lateral faces and bottom faces of the wiring groove 7c and the via hole 8a and on the entire upper face of the fourth insulation film 5. Subsequently, the pore seal film 6 on the bottom face of the via hole 8a is removed by Ar-resputtering.

Figure 2F:
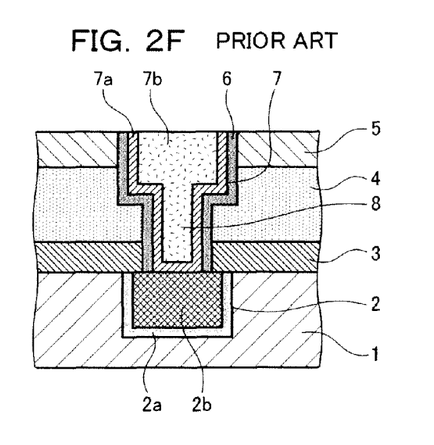
FIG. 2F is a cross-sectional diagram F corresponding to a process in the conventional method of manufacturing a semiconductor device.

Next, as shown in FIG. 2F, the barrier metal film 7a is deposited on wall faces and bottom faces of the wiring groove 7c and the via hole 8a. Subsequently, the barrier metal film on the bottom face of the via hole is removed by Ar-resputtering. A barrier metal film is then once again formed by sputtering. Subsequently, the conductive film 7b is deposited on the wiring groove 7c and the via hole 8a. Excess conductive film, barrier metal film and pore seal film outside of the wiring groove 7c is then removed by a CMP method to form the second metallic wire 7 and the via B.

In the process shown in FIG. 2F, the pore seal film 6 functions so as to block plasma exposure of the third insulation film 4 during the formation of the barrier metal film 7a.

However, with the conventional semiconductor device and the method of manufacturing the same described above, although plasma exposure of the third insulation film can be blocked by the pore seal film, the high relative permittivity of the pore seal film such as a SiCN film gives rise to an increase in the effective permittivity between interlayer insulation films in a wiring layer. As a result, signal delay on the wiring increases.

In addition, since the pore seal film contains Si—$CH_3$ bonds and is therefore vulnerable to plasma processing, the Si—CH₃ bonds in the low-permittivity film on the wall faces and bottom faces of the wiring groove and the via hole are separated by plasma processing applied to the wiring groove and the via hole during the barrier metal film formation process or the like. As a result, relative permittivity increases which, in turn, causes degradation of signal delay characteristics on the wiring.

DISCLOSURE OF THE INVENTION

The present invention has been made to solve the conventional problems described above, and an object of the present invention is to provide a semiconductor device including a metallic wire covered by a low-permittivity film and a method of manufacturing the same, wherein the semiconductor device is capable of: suppressing an increase in the permittivity of an entire first insulation film; suppressing an increase in the relative permittivity of a low permittivity film on wall faces and bottom faces of a wiring groove and a via hole; reducing signal delay on the wiring; and improving signal delay characteristics on the wiring until a desired state is reached.

In order to solve the problems described above, a semiconductor device according to the present invention includes: an interlayer insulation film formed so as to constitute a layer on a substrate; a via hole formed on the interlayer insulation film; a wiring groove formed on the interlayer insulation film so as to connect with the via hole; an inside-face insulation film formed so as to cover a bottom portion and lateral walls of the wiring groove and lateral walls of the via hole; a via where a conductive film is embedded in the via hole; and a wire where a conductive film is embedded in the wiring groove, wherein the inside-face insulation film is made up of a porous film.

Furthermore, in the semiconductor device described above, the permittivity of the entire interlayer insulation film is approximately equal to the permittivity of the inside-face insulation film.

Furthermore, in the semiconductor device described above, the permittivity of the interlayer insulation film in the vicinity of a portion in contact with the inside-face insulation film is approximately equal to the internal permittivity of the interlayer insulation film.

Furthermore, in the semiconductor device described above, the inside-face insulation film is made up of carbon-containing silicon with a relative permittivity of substantially 2.5 or lower.

Furthermore, in the semiconductor device described above, porosity and a pore size of the inside-face insulation film are higher than porosity and a pore size of an upper surface of the interlayer insulation film between the wires.

Moreover, a method of manufacturing a semiconductor device according to the present invention includes the steps of: (a) forming a via hole on an interlayer insulation film formed on a substrate; (b) forming a wiring groove on the interlayer insulation film after the step (a); (c) covering lateral walls and bottom portions of the via hole and the wiring groove with an inside-face insulation film after the step (b); (d) covering, via the inside-face insulation film, the lateral walls and bottom portions of the via hole and the wiring groove with a barrier metal film after the step (c); and (e) lowering the permittivity of the inside-face insulation film after the step (d).

Furthermore, in the method of manufacturing a semiconductor device described above, the permittivity of the interlayer insulation film is lowered in comparison to the permittivity of the inside-face insulation film formed in the step (c).

Furthermore, in the method of manufacturing a semiconductor device described above, the permittivity of the inside-face insulation film is lowered to substantially 2.5 or lower in the step (e).

Furthermore, in the method of manufacturing a semiconductor device described above, the inside-face insulation film formed in the step (c) is formed from carbon-containing silicon containing porogen.

Furthermore, in the method of manufacturing a semiconductor device described above, the inside-face insulation film formed in the step (c) is provided with a higher Si—CH₃/Si—O bond ratio than an upper surface of the interlayer insulation film between wires.

Furthermore, in the method of manufacturing a semiconductor device described above, the step (e) is a step for exposing an upper face of the inside-face insulation film to ultraviolet light.

Furthermore, in the method of manufacturing a semiconductor device described above, the step (e) is a step for exposing an upper face of the inside-face insulation film to an electron beam.

As described above, according to the present invention, in a semiconductor device including a metallic wire covered by a low-permittivity film, since an inside-face insulation film is a porous film with low permittivity, an increase in the relative permittivity of a low permittivity film on wall faces and bottom faces of a wiring groove and a via hole can be suppressed.

Consequently, an effect can be achieved where the effective permittivity between the wires is lowered, the signal delay on the wiring is reduced, and signal delay characteristics on the wiring can be improved to a desired state.

In addition, in a semiconductor device including a metallic wire covered by a low-permittivity film, since the permittivity value of an interlayer insulation film in the vicinity of a portion in contact with an inside-face insulation film approximates the internal permittivity value of a low-permittivity interlayer insulation film, an increase in the permittivity of the entire interlayer insulation film can be suppressed.

Consequently, an effect can be achieved where the permittivity of the entire interlayer insulation film is lowered, signal delay on the wiring is reduced, and signal delay characteristics on the wiring can be improved to a desired state.

DESCRIPTION OF THE EMBODIMENT

Hereinafter, a semiconductor device and a method of manufacturing the same representing an embodiment of the present invention will be specifically described with reference to the drawings.

Further, materials and numeric values used in the present invention are preferable examples but are not restrictive. The materials and numeric values can be appropriately changed without departing from the scope of the invention.

Figure 3:
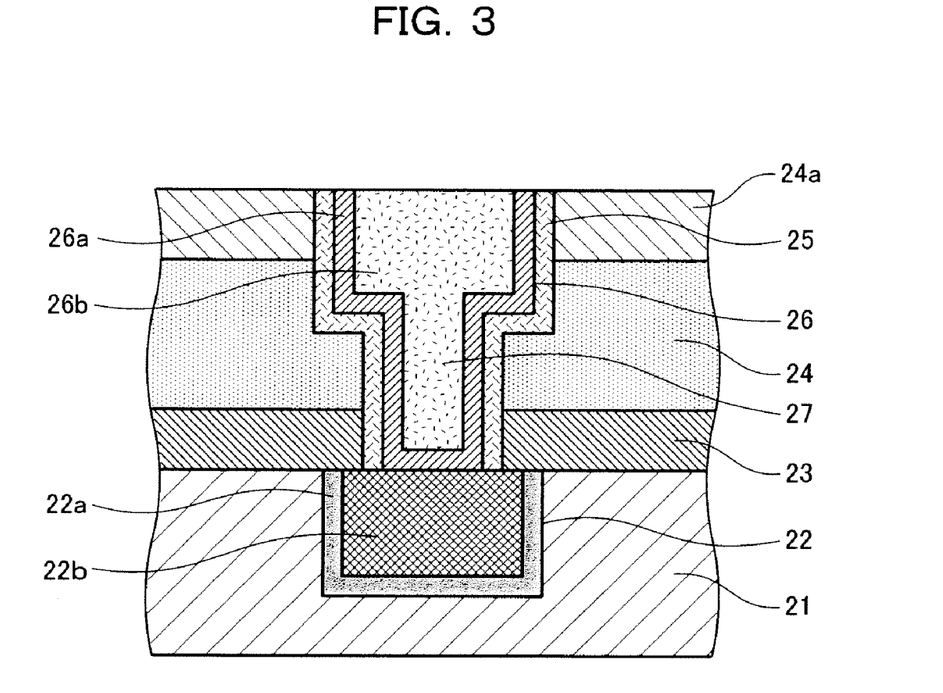
FIG. 3 is a cross-sectional view showing the structure of a wiring portion of a semiconductor device according to an embodiment of the present invention.

FIG. 3 shows a cross-sectional structure of a wiring portion of a semiconductor device according to the present embodiment. As shown in FIG. 3, a first metallic wire 22 is formed on a first insulation film 21 composed of silicon dioxide ($SiO_2$) and formed on top of a substrate (not shown) composed of Si by a barrier metal film 22a composed of tantalum nitride (TaN) and a conductive film 22b composed of copper (Cu). A second insulation film 23 composed of silicon carbide (SiC) and which functions as an anti-metallic diffusion film is formed on top of the first insulation film 21 so as to cover the first metallic wire 22.

A third insulation film 24 that is an interlayer insulation film composed of carbon-containing silicon oxide (SiOC) with a relative permittivity of substantially 3 or lower is formed on top of the second insulation film 23. In this case, the third insulation film 24 has a porosity of substantially 10.6% and a pore size φ of substantially 0.65 nm. Porosities and pore sizes in the present embodiment are determined by an ellipsometric porosimetric method.

A pore size is defined herein as a radius value of an approximately spherical space. In addition, porosity is defined herein as a value obtained by dividing the volume of voids existing in a film by the volume of the entire film. Furthermore, an ellipsometric porosimetric method is a method of calculating a pore size r and porosity X from vapor pressure and the refractive index of a sample when a solvent is adsorbed onto the sample under saturated vapor pressure. A pore size is calculated from the relationship between vapor pressure P and an amount of adsorption $V_L$ of a solvent such as toluene as expressed by Kelvin's formula $[\ln(P/P_0) = -V_L/(r \times R \times T)]$ when the solvent such as toluene is adsorbed onto a porous sample under saturated vapor pressure $P_0$, where R denotes the gas constant and T denotes the temperature of the solvent. In addition, porosity X can be calculated from the relationship between a refractive index $n_{sat}$ of a porous sample when a solvent such as toluene is adsorbed onto the sample under saturated vapor pressure, a refractive index $n_0$ of the sample when unadsorbed, and a refractive index $n_{sol}$ of the adsorbed solvent as expressed by $X = [(n_{sat}-1)/(n_{sat}+2) - (n_0-1)/(n_0+2)]/[(n_{sol}-1)/(n_{sol}+2)]$ (refer to References 1 and 2 provided below).

Reference 1: Seiichi Kondo et al., Kagaku Seminar 16 "Kyuchaku no Kagaku" (Seminar in Chemistry 16 "The Science of Adsorption"), Maruzen Co., Ltd.

Reference 2: Tominaga Keii, "Kyuchaku" ("Adsorption"), Kyoritsu Shuppan Co., Ltd.

In addition, formed on an upper face of the third insulation film 24 is a surface layer 24a (a film with relatively low porosity and small pore size compared to the third insulation film) with porosity of substantially 5% or less, a pore size φ of substantially 0.5 nm or less and a high permittivity (permittivity higher than substantially 3 and lower than substantially 4.3). In this case, the surface layer 24a functions to protect the upper face of the third insulation film 24 that is a low-permittivity film with high porosity when CMP polishing a conductive film 26b.

A fourth insulation film 25 that is an inside-face insulation film composed of carbon-containing silicon oxide (SiOC) with a relative permittivity of substantially 2.5 or less is formed on a bottom portion and lateral walls of a groove portion provided on the third insulation film 24. A second metallic wire 26 is formed by a barrier metal film 26a composed of TaN and formed so as to embed the groove portion and the conductive film 26b composed of Cu. In this case, the fourth insulation film 25 has porosity of substantially 25.7% and a pore size φ of substantially 0.80 nm.

The first metallic wire 22 and the second metallic wire 26 are electrically connected via a via 27 that penetrates the second insulation film 23 and the third insulation film 24.

The permittivity in the vicinity of a portion of the third insulation film, which is an interlayer insulation film, in contact with the fourth insulation film 25 that is an inside-face insulation film is approximately equal to the internal permittivity of the third insulation film. In this case, "the vicinity of a portion" refers to at least a distance equal to or greater than substantially 5 nm and equal to or less than substantially 30 nm.

In addition, the permittivity of the third insulation film that is an interlayer insulation film is preferably approximately equal to the permittivity of the fourth insulation film 25 that is an inside-face insulation film. Since the third insulation film is protected by the fourth insulation film 25, the vicinity of the portion of the third insulation film in contact with the fourth insulation film 25 is also approximately equal to the internal permittivity of the third insulation film. Therefore, the permittivity of the entire third insulation film is approximately equal to the permittivity of the fourth insulation film.

Next, a method of manufacturing a semiconductor device according to the present embodiment will be described with reference to FIGS. 4A to 4G.

FIGS. 4A to 4G are wiring cross-sectional diagrams of the semiconductor device in respective manufacturing processes according to the present embodiment.

Figure 4A:
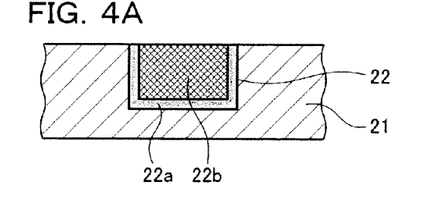
FIG. 4A is a cross-sectional diagram A corresponding to a process in a method of manufacturing a semiconductor device according to the present embodiment.

First, as shown in FIG. 4A, after forming the first insulation film 21 composed of SiO$_2$ on top of a substrate (not shown), a resist is applied on the first insulation film 21 to form a wiring groove pattern using a lithographic method. Subsequently, dry etching is performed using the wiring groove pattern as a mask, and the resist is removed by ashing to form a wiring groove on the first insulation film 21. The barrier metal film 22a composed of TaN is then formed by sputtering on the wiring groove, and the conductive film 22b composed of Cu is embedded by an electroplating method. Subsequently, excess barrier metal film 22a and conductive film 22b protruding out of the wiring groove are removed by a chemical mechanical polishing (CMP) method to form the first metallic wire 22 made up of the barrier metal film 22a and the conductive film 22b.

Figure 4B:
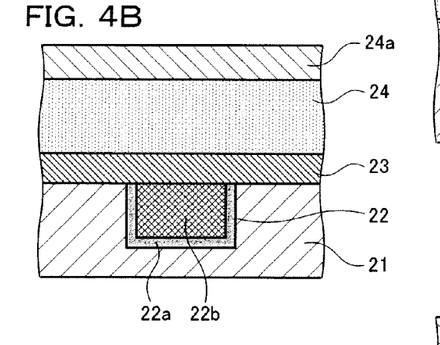
FIG. 4B is a cross-sectional diagram B corresponding to a process in the method of manufacturing a semiconductor device according to the present embodiment.

Next, as shown in FIG. 4B, the second insulation film 23 composed of SiC is formed substantially 50 nm by a chemical vapor deposition (CVD) method on top of the first insulation film 21 and the first metallic wire 22. Subsequently, the third insulation film 24 composed of SiOC with a relative permittivity of substantially 3 or less is formed substantially 550 nm on top of the second insulation film 23 by a chemical vapor deposition (CVD) method. The surface layer 24a for protecting the third insulation film 24 is formed on top of the third insulation film 24.

Figure 4C:
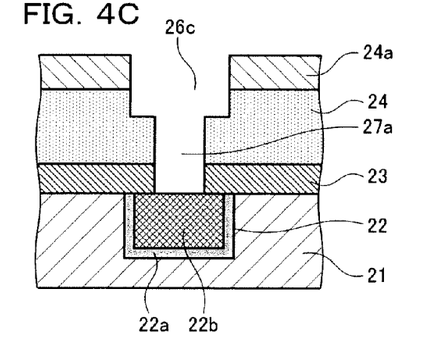
FIG. 4C is a cross-sectional diagram C corresponding to a process in the method of manufacturing a semiconductor device according to the present embodiment.

Next, as shown in FIG. 4C, a resist is applied on the surface layer 24a of the third insulation film 24 and a via hole pattern is formed using a lithographic method. Subsequently, dry etching and ashing are performed using the via hole pattern as a mask to form a via hole 27a that penetrates the second insulation film 23, the third insulation film 24 and the surface layer 24a. A resist is then applied to a surface of the surface layer 24a and a wiring groove pattern is formed using a lithographic method. Subsequently, dry etching and ashing are performed using the wiring groove pattern as a mask to form a wiring groove 26c on the third insulation film 24 and the surface layer 24a.

Figure 4D:
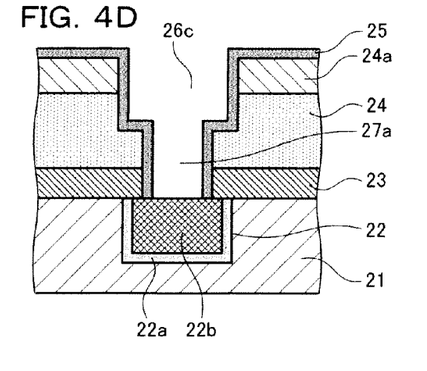
FIG. 4D is a cross-sectional diagram D corresponding to a process in the method of manufacturing a semiconductor device according to the present embodiment.

Next, as shown in FIG. 4D, the fourth insulation film 25 is formed substantially 20 nm by a CVD method on lateral faces and bottom faces of the wiring groove 26c and the via hole 27a and on the entire upper face of the surface layer 24a. Subsequently, the fourth insulation film 25 on the bottom face of the via hole 27a is removed by Ar-resputtering. In this case, the fourth insulation film 25 contains a high proportion of porogen and has a relative permittivity of around 3.0. Characteristics of the fourth insulation film 25 will be described later.

Figure 4E:
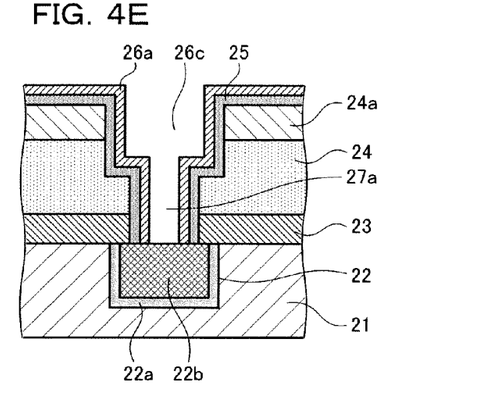
FIG. 4E is a cross-sectional diagram E corresponding to a process in the method of manufacturing a semiconductor device according to the present embodiment.

Next, as shown in FIG. 4E, after the barrier metal film 26a composed of TaN is formed by sputtering on lateral faces and bottom faces of the wiring groove 26c and the via hole 27a, the barrier metal film 26a on the bottom face of the via hole is removed by Ar-resputtering.

Figure 4F:
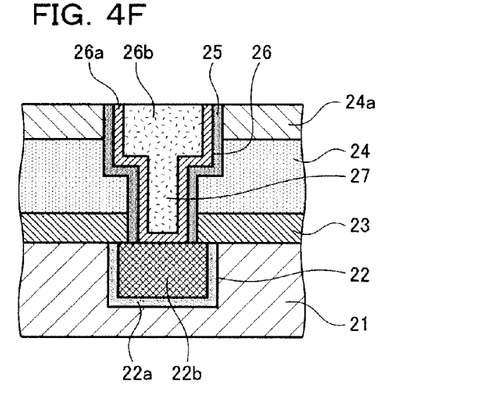
FIG. 4F is a cross-sectional diagram F corresponding to a process in the method of manufacturing a semiconductor device according to the present embodiment.

Next, as shown in FIG. 4F, the barrier metal film 26a is once again formed by sputtering and a conductive film 26b composed of Cu is formed by an electroplating method. Subsequently, excess of the barrier metal film 26a, the conductive film 26b, and the fourth insulation film protruding out of the wiring groove 26c is removed by a CMP method to form the second metallic wire 26, made up of the barrier metal film 26a and the conductive film 26b, and the via 27.

Figure 4G:
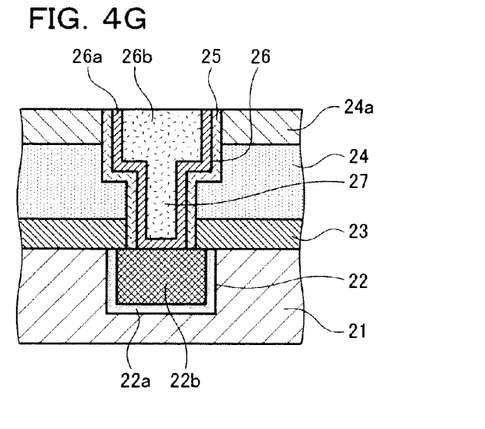
FIG. 4G is a cross-sectional diagram G corresponding to a process in the method of manufacturing a semiconductor device according to the present embodiment.

Next, as shown in FIG. 4G, the upper face of the third insulation film 24 is exposed to one of ultraviolet light and an electron beam. As a result, the relative permittivity of the fourth insulation film 25 changes to substantially 2.5 or lower.

At this point, it is favorable to perform one of ultraviolet light irradiation and electron beam irradiation in FIG. 4G after forming the cross section shown in FIG. 4F instead of performing one of ultraviolet light irradiation and electron beam irradiation immediately after forming the fourth insulation film 25 in FIG. 4D. The reason thereof will now be described.

Since performing one of ultraviolet light irradiation and electron beam irradiation immediately after forming the fourth insulation film 25 in FIG. 4D results in porogen separation, the fourth insulation film 25 ends up being reformed when forming the barrier metal film 26a in the subsequent process of FIG. 4E, thereby causing an increase in relative permittivity. In this case, one of ultraviolet light irradiation and electron beam irradiation is capable of achieving reforming down to a deep portion of the insulation films across the insulation films 23, 24 and 24a. As described above, it is preferable to perform one of ultraviolet light irradiation and electron beam irradiation in FIG. 4G after forming the cross section shown in FIG. 4F.

The relationship between separation of porogen of the fourth insulation film 25 and a relaxation of impact made by barrier metal sputtering will be described below.

Characteristics of the fourth insulation film 25 will now be described in detail. The fourth insulation film 25 formed by the cross-sectional diagram shown in FIG. 4D is formed from one of organosilane and organosiloxane as a raw material by a CVD method using a gas system containing He or O$_2$ at a film formation temperature of substantially 200 to 400° C.

and under a chamber pressure of substantially 500 to 1000 pa and an RF power of substantially 200 to 700 W.

As a result, the fourth insulation film 25 is formed with a high proportion of porogen and a relative permittivity of around 3.0. Examples of the fourth insulation film 25 include BD film (registered trademark: Black Diamond) by Applied Materials, Inc., CORAL film (registered trademark: CORAL) by Novellus Systems, Inc., and Aurora film (registered trademark: Aurora) by ASM Japan K. K. In addition, porogen is composed of cyclic hydrocarbon having a composition of $C_{10}H_{16}$ or the like.

Measurement results of the quantity of porogen contained in the fourth insulation film 25 and the relative permittivity thereof before and after sputter-forming the barrier metal film 26a on top of the fourth insulation film 25 formed under the conditions described above are shown in FIG. 5.

In this case, the quantity of porogen is calculated from the hydrocarbon component obtained by thermal desorption spectroscopy (TDS). A reduction in TDS degassing amount indicates a decrease in the quantity of porogen. As is apparent from FIG. 5, the quantity of porogen in the film decreases after barrier sputtering (indicated by black square), and the relative permittivity decreases.

Figure 6:
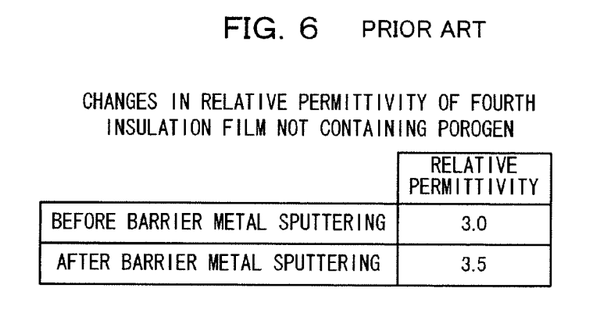
FIG. 6 is an explanatory diagram showing measurement results of relative permittivity of an insulation film not containing porogen before and after sputter-forming a barrier metal film on top of the insulation film in the conventional method of manufacturing a semiconductor device.

Meanwhile, measurement results of the relative permittivity of an insulation film not containing porogen before and after sputter-forming a barrier metal film on top of the insulation film are shown in FIG. 6.

As is apparent from FIG. 6, with an insulation film not containing porogen, barrier metal sputtering causes a significant increase in the relative permittivity of the insulation film.

Figure 5:
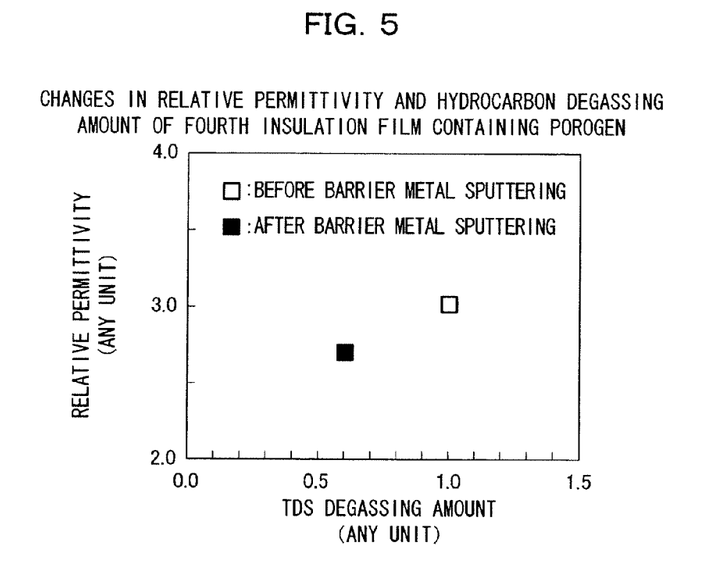
FIG. 5 is an explanatory diagram showing measurement results of the quantity of porogen contained in a fourth insulation film and relative permittivity before and after sputter-forming a barrier metal film on top of the fourth insulation film in the method of manufacturing a semiconductor device according to the present embodiment.

Phenomena caused by porogen contained in an insulation film when a barrier metal film is sputtered onto the porogen-containing insulation film shown in FIG. 5 will now be described.

Figure 7:
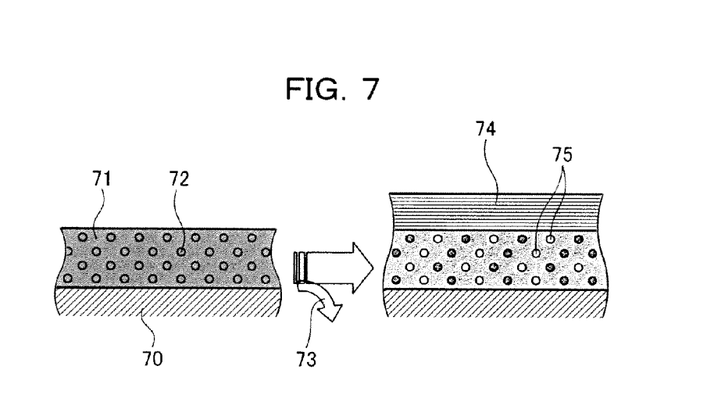
FIG. 7 is a schematic diagram showing a situation where porogen is desorbed from a porogen-containing film after sputtering to form a pore in a method of manufacturing a semiconductor device according to an embodiment of the present invention.

FIG. 7 shows how, after sputtering, desorption 73 of a portion of porogen 72 occurs from an insulation film 71 containing the porogen 72 on a substrate 70 to form a pore 75. In other words, thermal energy applied when sputtering a barrier metal film 74 onto the insulation film 71 including the porogen 72 is converted into energy that desorbs the porogen 72 itself from the insulation film 71. The pore 75 then remains after the desorption 73 of the porogen.

On the other hand, thermal energy applied when sputtering a barrier metal film onto an insulation film not containing porogen acts as energy that dissociates the Si—$CH_3$ bonds in the insulation film. Subsequently, the Si—$CH_3$ binds with the oxygen in the film and condenses. As a result, relative permittivity increases. In other words, when porogen is introduced into the fourth insulation film 25 formed prior to barrier metal sputtering, excess thermal energy applied during barrier metal sputtering enables suppression of an increase in the relative permittivity of the film. The permittivity of the fourth insulation film 25 after porogen detachment contributes largely to the permittivity between wires. In addition, while a portion of the porogen is extracted during barrier film formation and a portion of pores is formed, permittivity does not significantly decrease.

Next, a process will be described in which, by exposing the upper face of the third insulation film 24 to one of ultraviolet light and an electron beam in FIG. 4G, the relative permittivity of the fourth insulation film 25 changes to substantially 2.5 or less.

Ultraviolet light irradiation is performed under the following conditions: a temperature range of substantially 300° C. to 450° C.; a pressure range of substantially $10E^{-8}$ Pa to 1 atm; an ultraviolet light power of substantially 1 kW to 10 kW; an irradiation period of substantially 240 seconds to 1200 seconds; and a nitrogen atmosphere containing nitrogen and at least one element other than nitrogen. In addition, electron beam irradiation is performed under the following conditions: a temperature range of substantially 300° C. to 450° C.; a pressure range of substantially $10E^{-8}$ Pa to $10E^{-4}$ Pa; an electron beam power of substantially 10 kW to 30 kW; an electron beam irradiation period of substantially 60 seconds to 180 seconds; and a helium atmosphere.

Figure 8:
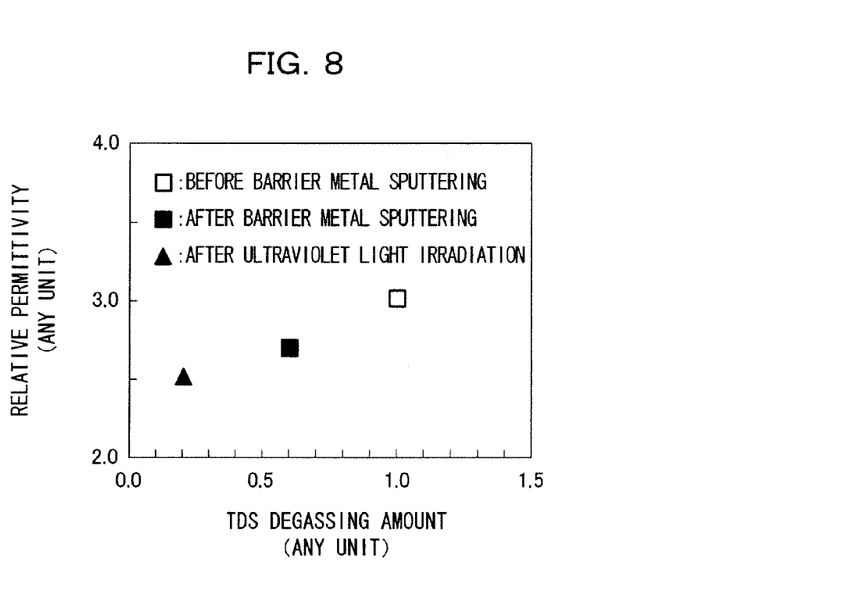
FIG. 8 is an explanatory diagram showing measurement results of the quantity of porogen contained in a fourth insulation film and relative permittivity in a case where a barrier metal film is sputtered on top of the fourth insulation film and the fourth insulation film is subsequently irradiated by ultraviolet light in the method of manufacturing a semiconductor device according to the present embodiment.

Measurement results of the quantity of porogen contained in the fourth insulation film 25 and the relative permittivity thereof when ultraviolet light irradiation is applied after sputtering the barrier metal film 26a on the fourth insulation film 25 formed using the method described above are shown in FIG. 8. As shown in FIG. 8, the quantity of porogen in the film decreases after barrier sputtering (indicated by black square). Subsequently, as ultraviolet light processing is performed (indicated by black triangle), porogen is almost completely extracted and the relative permittivity of the film can be lowered to substantially 2.5 or less. As a result, since the relative permittivity of the insulation film adjacent to wiring can be lowered to substantially 2.5 or less by performing the exposure processing described above after wiring formation, a semiconductor device with low wiring delay can be achieved.

The permittivity-lowered fourth insulation film 25 formed by the method described above is composed of carbon-containing silicon having any one of the following characteristics: a density of substantially 1.0 to 1.3 g/cc; a pore size of substantially 0.8 to 1.2 nm; porosity of substantially 20% or more; and a Si—$CH_3$/Si—O bond ratio of substantially 2.5 or less.

Next, an evaluation result of an inter-wiring capacity in a structure formed by a method of manufacturing a semiconductor device according to the present embodiment will be described.

Figure 9:
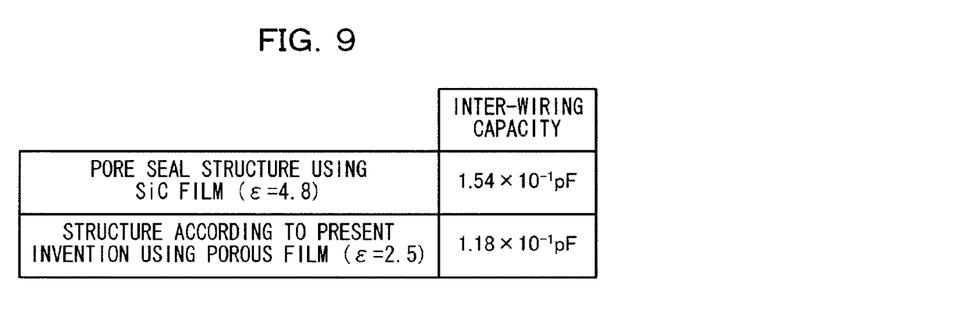
FIG. 9 is a comparative explanatory diagram that compares an inter-wiring capacity in a structure in which an insulation film is used as wiring lateral walls with an inter-wiring capacity in a structure in which a pore seal film is used as wiring lateral walls in the semiconductor device according to the present embodiment.

FIG. 9 is a comparison result of an inter-wiring capacity between a structure using a pore seal film as wiring lateral walls as is conventional and a structure using the insulation film 25 (a porous film subsequent to near-complete porogen extraction) according to the present embodiment as wiring lateral walls. As shown in FIG. 9, with the structure according to the present embodiment, an inter-wiring capacity is dramatically lowered.

As described above, it is now confirmed that by lowering the relative permittivity of the fourth insulation film 25 adjacent to the second metallic wire 26, an inter-wiring capacity can be lowered and low wiring delay can be achieved.

Next, an evaluation result of the effective permittivity of a wiring layer in a structure formed by the method of manufacturing a semiconductor device according to the present embodiment will be described.

Figure 10:
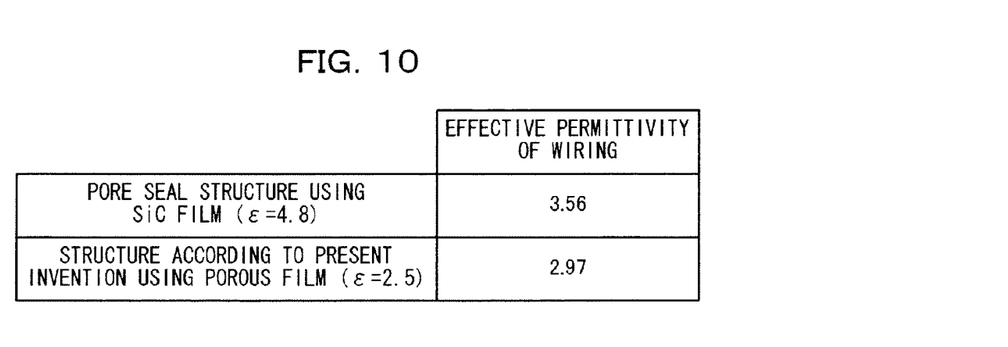
FIG. 10 is a comparative explanatory diagram that compares the effective permittivity of a wiring layer in a structure in which the insulation film is used as wiring lateral walls with the effective permittivity of a wiring layer in a structure in which a pore seal film is used as wiring lateral walls in the semiconductor device according to the present embodiment.

FIG. 10 is a comparison result of the effective permittivity of a wiring layer between a structure using a pore seal film as wiring lateral walls as is conventional and a structure using the insulation film 25 (a porous film subsequent to near-complete porogen extraction) according to the present embodiment as wiring lateral walls. As shown in FIG. 10, with the structure according to the present embodiment, the effective permittivity of a wiring layer is dramatically lowered. As described above, it is now confirmed that by lowering the relative permittivity of the fourth insulation film 25 adjacent to the second metallic wire 26, the effective permittivity of a wiring layer can be lowered and low wiring delay can be achieved.

In the present embodiment, while ultraviolet light irradiation is performed as processing for lowering the permittivity of the fourth insulation film 25, methods of lowering the permittivity are not limited to ultraviolet light irradiation. Other methods may include irradiating an electron beam on the fourth insulation film 25 to lower the relative permittivity of the fourth insulation film 25.

Electron beam irradiation is more favorable than ultraviolet light irradiation, and the reason thereof will be described below.

Figure 11A:
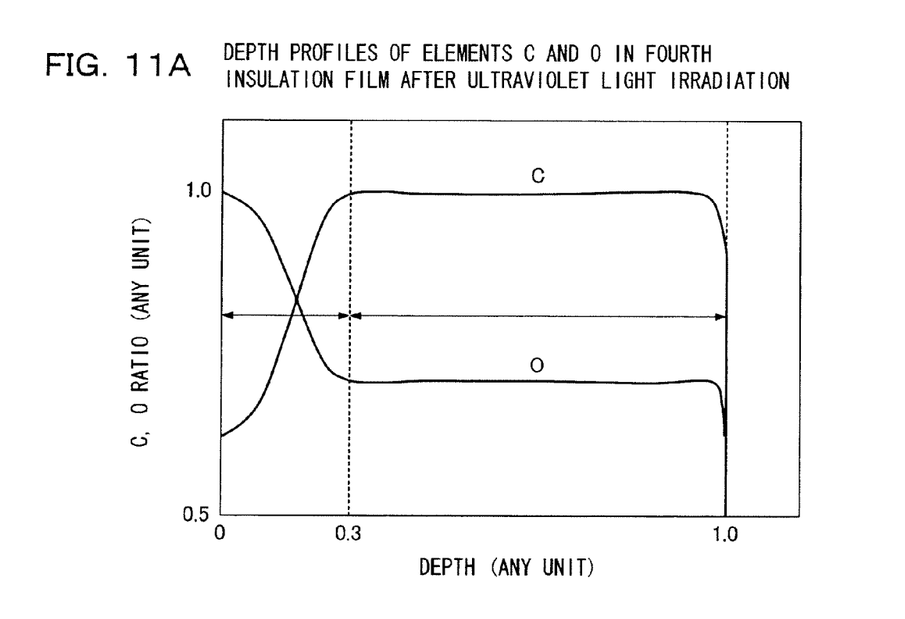
FIG. 11A is an explanatory diagram of a profile of elements C and O contained in a fourth insulation film after ultraviolet light irradiation taken in a direction of film depth in the semiconductor device according to the present embodiment.
Figure 11B:
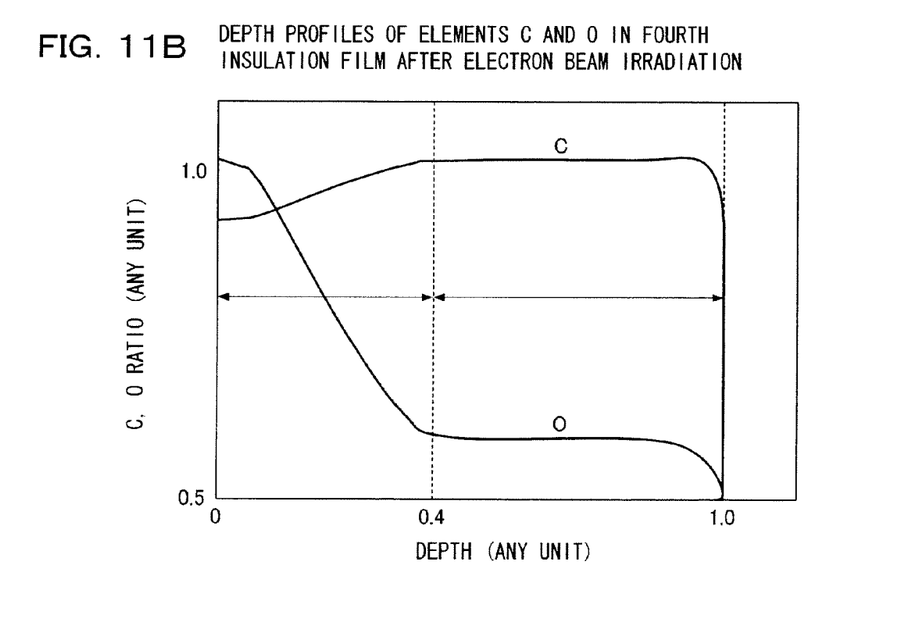
FIG. 11B is an explanatory diagram of a profile of elements C and O contained in the fourth insulation film after electron beam irradiation taken in the direction of film depth in the semiconductor device according to the present embodiment.

FIG. 11A shows depth-direction distribution quantities of carbon atoms and hydrogen atoms contained in the fourth insulation film 25 after ultraviolet light irradiation. On the other hand, FIG. 11B shows depth-direction distribution quantities of carbon atoms and hydrogen atoms contained in the fourth insulation film 25 after electron beam irradiation. In FIG. 11A, the abscissa represents a depth. The closer the value is to 1.0, the closer in proximity to the substrate. A value of 0 represents an irradiated face of the fourth insulation film 25. In addition, the ordinate represents ratios of carbon atoms in respective depth directions when a point where the amount of carbon atoms is maximum is represented by 1.0 as well as ratios of oxygen atoms in respective depth directions when a point where the amount of oxygen atoms is maximum is represented by 1.0.

Furthermore, the relationship between the abscissa and the ordinate of FIG. 11B is similar to FIG. 11A. As is apparent from comparing FIGS. 11A and 11B, the proportion of oxygen atoms in the vicinity of the irradiated face is higher when irradiating an electron beam on the fourth insulation film 25 as compared to when irradiating ultraviolet light. Reliability between wires is significantly affected by the degree of adhesion between an inter-wiring liner film and a lower-level insulation film. In other words, the higher the degree of adhesion between an inter-wiring liner film and a lower-level insulation film, the greater the resistance to pressure and, in turn, the greater the reliability. Since oxygen atoms in the insulation film significantly affect adhesion, the effect of improving reliability is higher in electron beam irradiation with a higher ratio of oxygen atoms in the vicinity of an irradiated face as compared to ultraviolet light irradiation.

Since it is obvious that electron beam irradiation can also change the fourth insulation film 25 into a low-permittivity film with a permittivity of substantially 2.5 or lower, the same effects as the method of manufacturing a semiconductor device according to the embodiment of the present invention described above can be achieved.

While the present embodiment has adopted a configuration in which the fourth insulation film 25 that is a low-permittivity film is formed by a CVD method, the present invention is not limited to this configuration. For example, a configuration may be adopted in which a film is formed by applying a substance containing Si, O and C such as methyl silsesquioxane (MSQ) or methyl hydrogen silsesquioxane (MHSQ).

Since the effects of suppressing an increase in relative permittivity during formation of the barrier metal film 26a by the fourth insulation film 25 and lowering the relative permittivity of an insulation film adjacent to wiring as shown in the present embodiment can also be achieved using such films, the same effects as the method of manufacturing a semiconductor device according to the embodiment of the present invention described above can be achieved.

What is claimed is:

1. A method of manufacturing a semiconductor device comprising the steps of:
    (a) forming a via hole on an interlayer insulation film formed on a substrate;
    (b) forming a wiring groove on the interlayer insulation film after the step (a);
    (c) covering lateral walls and bottom portions of the via hole and the wiring groove with an inside-face insulation film after the step (b);
    (d) covering, via the inside-face insulation film, the lateral walls and bottom portions of the via hole and the wiring groove with a barrier metal film after the step (c); and
    (e) lowering permittivity of the inside-face insulation film after the step (d).

2. The method of manufacturing a semiconductor device according to claim 1, wherein permittivity of the interlayer insulation film is lowered in comparison to the permittivity of the inside-face insulation film formed in the step (c).

3. The method of manufacturing a semiconductor device according to claim 1, wherein the permittivity of the inside-face insulation film is lowered to substantially 2.5 or lower in the step (e).

4. The method of manufacturing a semiconductor device according to claim 1, wherein the inside-face insulation film formed in the step (c) is formed from carbon-containing silicon containing porogen.

5. The method of manufacturing a semiconductor device according to claim 1, wherein the inside-face insulation film formed in the step (c) is provided with a higher Si—$CH_3$/Si—O bond ratio than an upper surface of the interlayer insulation film between wires.

6. The method of manufacturing a semiconductor device according to claim 1, wherein the step (e) is a step for exposing an upper face of the inside-face insulation film to ultraviolet light.

7. The method of manufacturing a semiconductor device according to claim 1, wherein the step (e) is a step for exposing an upper face of the inside-face insulation film to an electron beam.

* * * * *